US011225195B2

United States Patent
Nagase et al.

(10) Patent No.: US 11,225,195 B2
(45) Date of Patent: Jan. 18, 2022

(54) OCCUPANT STEP WITH KICK SENSOR

(71) Applicant: AISIN TECHNICAL CENTER OF AMERICA, INC., Northville, MI (US)

(72) Inventors: Koji Nagase, Novi, MI (US); Daisuke Yamada, Ann Arbor, MI (US)

(73) Assignee: AISIN TECHNICAL CENTER OF AMERICA, INC., Northville, MI (US)

( * ) Notice: Subject to any disclaimer, the term of this patent is extended or adjusted under 35 U.S.C. 154(b) by 334 days.

(21) Appl. No.: 16/259,397

(22) Filed: Jan. 28, 2019

(65) Prior Publication Data

US 2020/0238916 A1 Jul. 30, 2020

(51) Int. Cl.
*B60R 3/02* (2006.01)
*H03K 17/955* (2006.01)
*E05F 15/73* (2015.01)
*E05F 15/41* (2015.01)

(52) U.S. Cl.
CPC .............. *B60R 3/02* (2013.01); *E05F 15/41* (2015.01); *E05F 15/73* (2015.01); *H03K 17/955* (2013.01); *E05Y 2400/858* (2013.01); *E05Y 2900/546* (2013.01)

(58) Field of Classification Search
CPC . B60R 3/02; E05F 15/41; E05F 15/73; H03K 17/955; E05Y 2400/858; E05Y 2900/546
See application file for complete search history.

(56) References Cited

U.S. PATENT DOCUMENTS

| 6,160,370 A | 12/2000 | Ohnuma | |
|---|---|---|---|
| 10,336,260 B1* | 7/2019 | Salter | B60R 3/002 |
| 2016/0083995 A1* | 3/2016 | Dezorzi | G07C 9/28 340/5.72 |
| 2016/0339844 A1* | 11/2016 | Pribisic | B60R 3/02 |
| 2018/0258680 A1 | 9/2018 | Shitara | |
| 2018/0258681 A1 | 9/2018 | Kanematsu | |
| 2019/0078371 A1* | 3/2019 | Pohl | E05F 15/76 |

FOREIGN PATENT DOCUMENTS

| DE | 35 13 051 A1 | 10/1986 |
|---|---|---|
| DE | 10 2012 010 124 A1 | 12/2012 |

* cited by examiner

*Primary Examiner* — Peter D Nolan
*Assistant Examiner* — Roy Rhee
(74) *Attorney, Agent, or Firm* — Oblon, McClelland, Maier & Neustadt, L.L.P.

(57) ABSTRACT

An occupant step apparatus and method for a vehicle, includes a powered occupant step, a kick sensor mounted to the occupant step, and a controller having processing circuitry. The processing circuitry detects a kick gesture signal from the kick sensor, controls operation of the powered occupant step to move the occupant step, and upon detection of a step gesture signal from the kick sensor while the occupant step is being operated, halts operation of the occupant step.

20 Claims, 8 Drawing Sheets

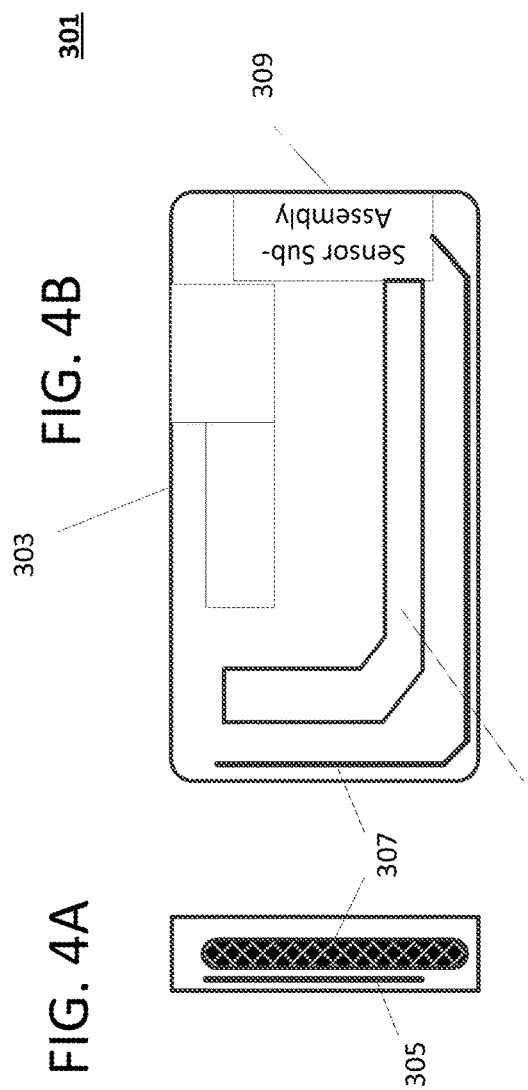
FIG. 4A
FIG. 4B
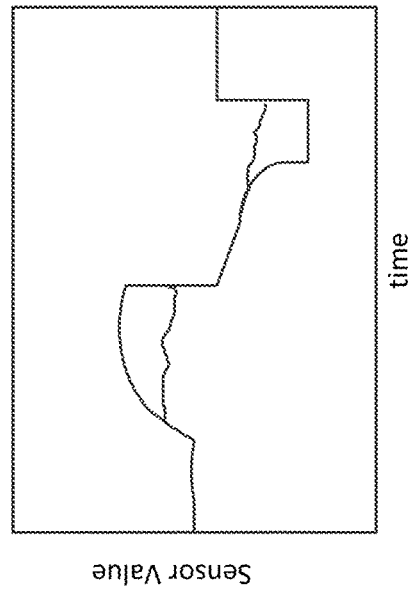
FIG. 5B
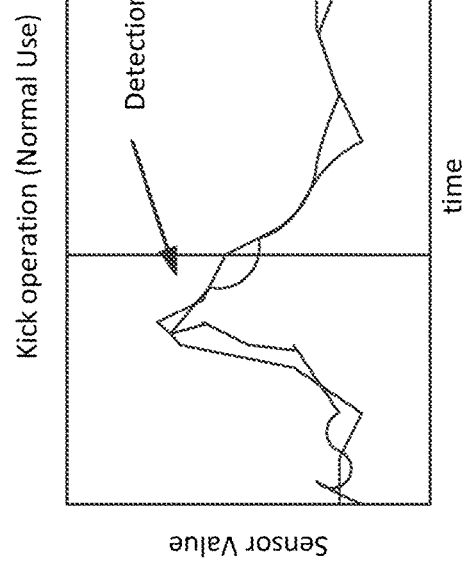
FIG. 5A

OCCUPANT STEP WITH KICK SENSOR

BACKGROUND OF THE INVENTION

Field of the Invention

The present disclosure relates generally to a powered occupant step with a kick sensor, and particularly a controller that controls the occupant step when the kick sensor detects occupant stepping onto or off of the occupant step during operation of the occupant step.

Description of the Related Art

Vehicles having a truck bed, such as a pickup truck or similar vehicles may be provided with a bed step (herein also referred to as an occupant step). The occupant step is a step that can be used to easily get on and off a tailgate of the vehicle in order to load and unload items in the truck bed. Both the occupant step and the tailgate may be driven by motors. Each of the motors may be controlled by electronic control units (ECU's). One motor extends the occupant step. The other motor opens the tailgate. Each motor may perform an inverse operation of retracting the occupant step and closing the tailgate, respectively. In some cases, a vehicle may be equipped with two occupant steps, one in the vicinity of each corner in the rear of the vehicle.

To operate the motor driven occupant step and motor driven tailgate, a person will approach the rear of the vehicle and may grip a handle on the tailgate. The person will press or lift the handle to release the tailgate latch. Releasing the tailgate latch causes the motor driven occupant step to extend. The releasing of the tailgate latch will also cause the tailgate to open. The person may then step on the occupant step up to the tailgate and enter the truck bed. However, the motor operated occupant step and the motor operated tailgate are independently controlled by respective ECU's.

The foregoing "Background" description is for the purpose of generally presenting, the context of the disclosure. Work of the inventor, to the extent it is described in this background section, as well as aspects of the description which may not otherwise qualify as prior art at the time of filing, are neither expressly or impliedly admitted as prior art against the present invention.

SUMMARY OF THE INVENTION

The present disclosure relates to a powered occupant step with a kick sensor. An occupant step apparatus and method for a vehicle includes a powered occupant step, a kick sensor mounted to the occupant step, and a controller having processing circuitry. The processing circuitry detects a kick gesture signal from the kick sensor, controls operation of the powered occupant step to move the occupant step, and upon detection of a step gesture signal from the kick sensor while the occupant step is being operated, halts operation of the occupant step.

The foregoing paragraph has been provided by way of general introduction, and is not intended to limit the scope of the following claims. The described embodiments, together with further advantages, will be best understood by reference to the following detailed description taken in conjunction with the accompanying drawings.

BRIEF DESCRIPTION OF THE DRAWING

A more complete appreciation of the disclosure and many of the attendant advantages thereof will be readily obtained as the same becomes better understood by reference to the following detailed description when considered in connection with the accompanying drawings, wherein:

FIGS. 4A, 4B illustrate an occupant step with a kick sensor in accordance with an exemplary aspect of the disclosure;

FIGS. 5A, 5B are graphs for operation of the kick sensor of FIGS. 4A, 4B in accordance with an exemplary aspect of the disclosure;

DETAILED DESCRIPTION

Figure 1:
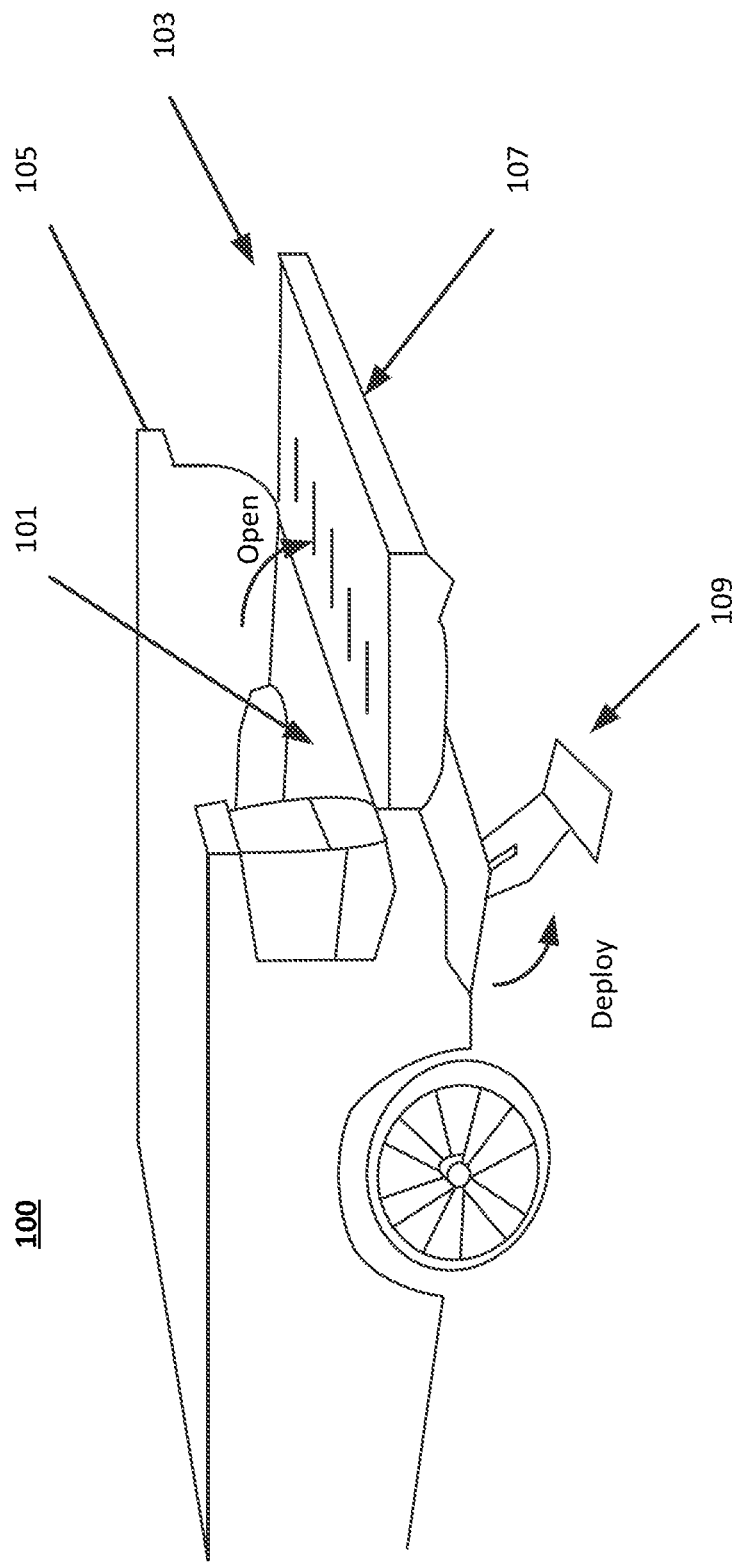
FIG. 1 illustrates a vehicle having a tailgate and occupant step to allow a person to step into a truck bed.

Referring now to the drawings, wherein like reference numerals designate identical or corresponding parts throughout several views, the following description relates to a tailgate interlocking occupant step assembly for a vehicle. Vehicles may include powered occupant steps and powered tailgates that are independently controlled and operated. FIG. 1 illustrates a vehicle having a tailgate and an occupant step. One mode of operation of the vehicle 100 has been for a person to grip the tailgate handle 107, causing the tailgate latch 105 to be released. The dampened tailgate 103 opens. A motor-operated occupant step 109 may be independently deployed. The tailgate 103 and the occupant step 109 may be independently reversed to close and retract, respectively.

In a case that a person is hit by the occupant step 109 when it is being operated to extend and a pinch is detected, the operation of the occupant step 109 may be stopped by its respective electronic control unit (ECU). Pinching may be detected by a change in motor rotation speed. There is a delay period of time while the motor is stabilizing. Also, the detection of pinching will be subject to a pinch threshold so that pinch control does not malfunction due to factors such as dust, age deterioration, and mechanical variation. Thus, a pinch load may become high before operation of the occupant step is stopped. If the object being pinched is a person's foot, the pinch load may be harmful.

A person may also be hit by the occupant step 109 when it is being retracted. If pinching is detected against a foreign object, operation to extend the occupant step may be stopped, and then reversed. If a person tries to step on the occupant step when it stops at an intermediate position, the person may be hit by the occupant step as it begins to retract, and may even be pinched by the occupant step as it approaches its retracted position. Again, the pinch load may be high and be harmful to the person. Disclosed are embodiments that provide a solution to these problems.

Figure 2:
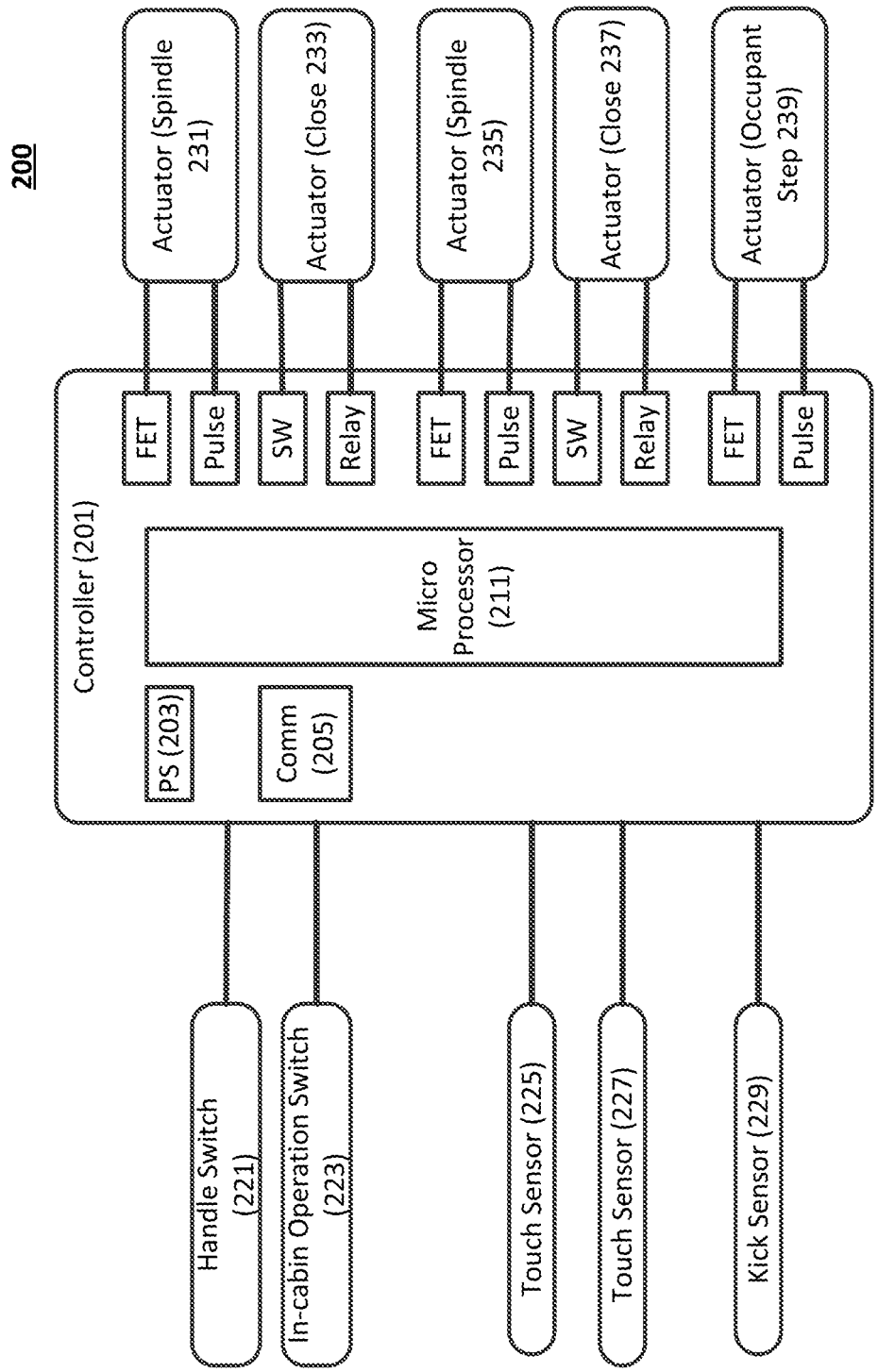
FIG. 2 is a block diagram of a control system in accordance with an exemplary aspect of the disclosure.

FIG. 2 is a block diagram of a control system in accordance with are exemplary aspect of the disclosure. The drawing is for purposes of explaining a basic controller and is non-limiting. The control system 200 may include a controller 201 having a micro-processor 211 implemented as processing circuitry. The controller 201 may include a power supply 203 and a communications circuit 205 for interfacing with other controllers in the vehicle and/or other external control devices. The controller 201 may include one or more digital and/or analog interfaces for sensors, providing input signals to the controller 201. The controller 201 may include specialized circuits and relays providing output control signals for control of actuators.

The micro-processor 211 may be an integrated circuit board having a processing chip, memory modules and I/O interfaces. The micro-processor 211 may include a security chip and other specialized processing devices such as a math co-processor. Memory modules may include Read Only Memory (ROM), Random Access Memory (RAM) and variants of non-volatile and volatile memory. In the case of a security chip, the security chip may have a dedicated secure memory. Any or all of the processors may include one or more processor cores.

Types of sensors may include a handle itch 221, an in-cabin operation switch 223, touch sensors 225, 227, and a kick sensor 229. The control system 200 is not limited to the sensors depicted in the drawing. For example, there may be several handle switches 221 and in-cabin operation switches 223 depending on the arrangement of the vehicle. The umber and arrangement of touch sensors 225, 227 is dependent on the size and configuration of a touch surface or various touch surfaces on the vehicle. There may be several different kick sensors, each of different type and arrangement, or similar sensors at different locations. In addition, the controller 201 may receive signals from other types of sensors depending on the configuration of the particular vehicle.

Types of actuators may include actuators for small motors that can perform operations such as open and close doors or lift gates. An actuator for a motor may rotate a spindle. An aspect is an actuator that rotates a spindle 231 that moves a door or tailgate to an opened position. The actuator 231 may be controlled to stop operation of opening the door or tailgate at a position that is, between fully closed or fully opened upon detection of an opposing force. In some embodiments an opposing force may be determined by detection of a predetermined torque on the respective motor spindle. The opposing force may be encountered when the door or tailgate comes into contact with a person or some other object and the person or other object is either not movable, or pushes back against the door or tailgate. There may be any number of actuators, e.g., 233, 235, 237, depending on the arrangement of doors and tailgate for a particular vehicle.

The control system 200 may include one or more actuators 239 for powered occupant steps. The actuators for the powered occupant steps may be controlled to stop operation at an intermediate position when an opposing force is detected. An opposing force may be encountered when an occupant step comes into contact with an obstacle.

Figure 3:
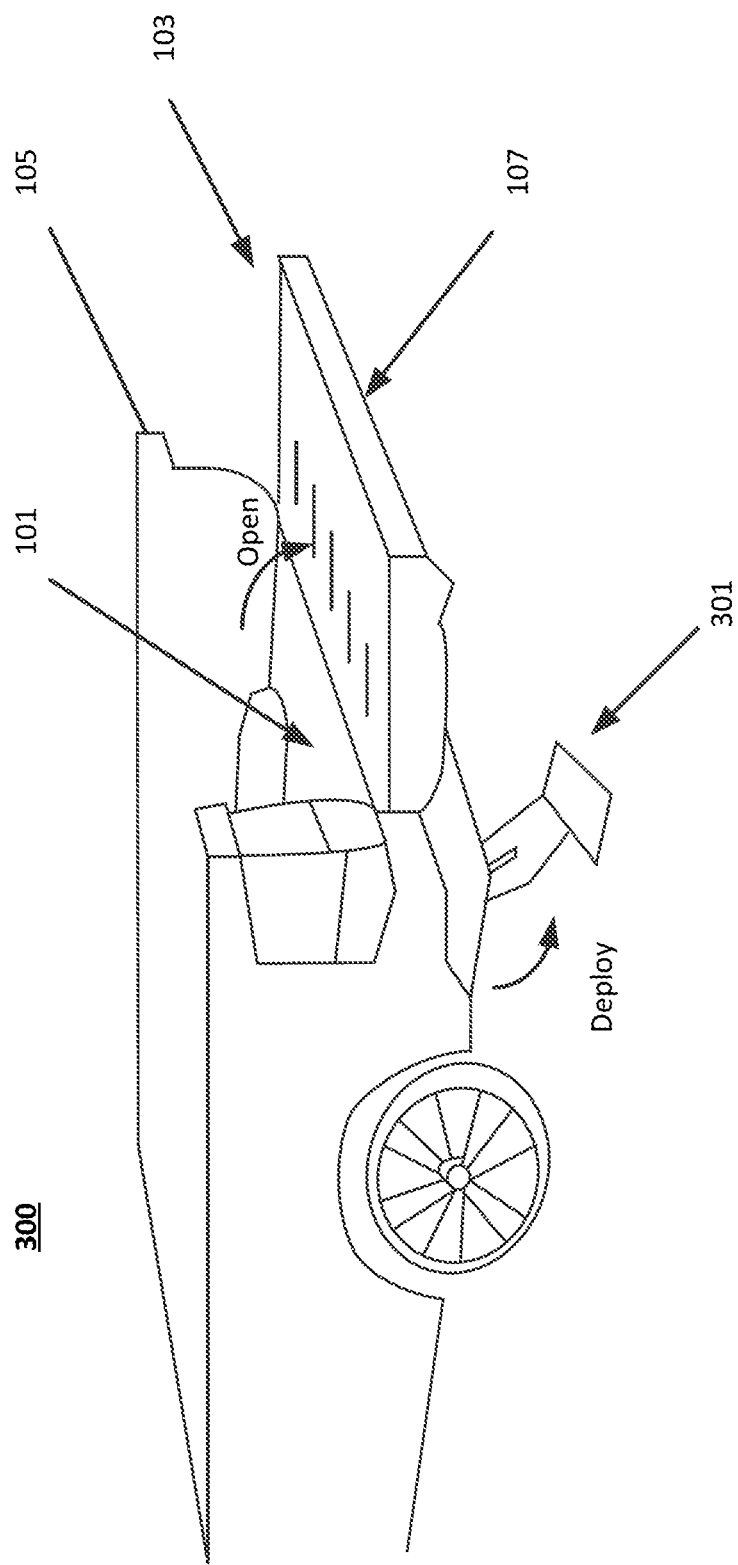
FIG. 3 illustrates a vehicle having a tailgate and occupant step in accordance with an exemplary aspect of the disclosure.

FIG. 3 illustrates a vehicle having a tailgate and occupant step in accordance with an exemplary aspect of the disclosure. In addition to a bed 101, tailgate 103, door handle 107 (underneath the tailgate when the tailgate is in the fully opened position), and tailgate latch 105, the vehicle 300 includes a powered occupant step 301. The powered occupant step 301 may be a motor-operated occupant step that includes a motor and a spindle. The powered occupant step 301 may also be moved by other devices, such as a hydraulic system.

FIGS. 4A and 4B illustrate an occupant step with a kick sensor in accordance with an exemplary aspect of the disclosure. FIG. 4A is a side view and FIG. 4B is an upper view of the occupant step. The occupant step 301 may be equipped with one or more kick sensors 305, 307. A kick sensor 307 may be embedded in the occupant step 301 to detect a kick gesture from below the occupant step 301. Another kick sensor 305 may be arranged near an upper surface of the occupant step 301 to detect a step gesture from above the occupant step 301. Both kick sensors 305 and 307 may include a sensor sub-assembly 309 that transmits sensor signals to the controller 201. A kick sensor is a sensor that indicates that another object is proximate to the sensor. An example of a kick sensor may be a capacitive proximity sensor having a plate through which current flows as an object comes within a certain distance of the sensor. The plate may be of such a shape that it will detect a person's foot moving to within a certain distance of the plate. In some embodiments, the plate is substantially L-shaped formed along the corner of the occupant step that faces the corner of the vehicle where the occupant step is mounted. The plate may also be C-shaped or rectangular shaped depending on such factors as the size of the occupant step, or the height of the underside of the vehicle from the ground. The plate may be made of a conductive metal that will maintain conduciveness over time, such as stainless steel. In some embodiments, the capacitive sensor detects an approaching object by a change in capacitance to a predetermined capacitance threshold.

FIGS. 5A and 5B are graphs for operation of the kick sensor of FIGS. 4A, 4B. The kick sensor 307 detects a kick gesture from below the occupant step 301. According to the graph in FIG. 5A, the sensor signal increases as a person's foot approaches the occupant step 301, reaches a peak and then drops off as the person's foot moves away from the occupant step 301, and thus the kick sensor 307 indicates a kick operation. The kick sensor 305 detects a step gesture from above the occupant step 301. According to the graph in FIG. 5B, the sensor signal appears as an upward square pulse signal as the occupant steps onto the occupant step 301, then appears as a downward square pulse signal as the occupant steps off of the occupant step 301. Thus, the kick sensor 305 indicates a step on/off operation.

Figure 6:
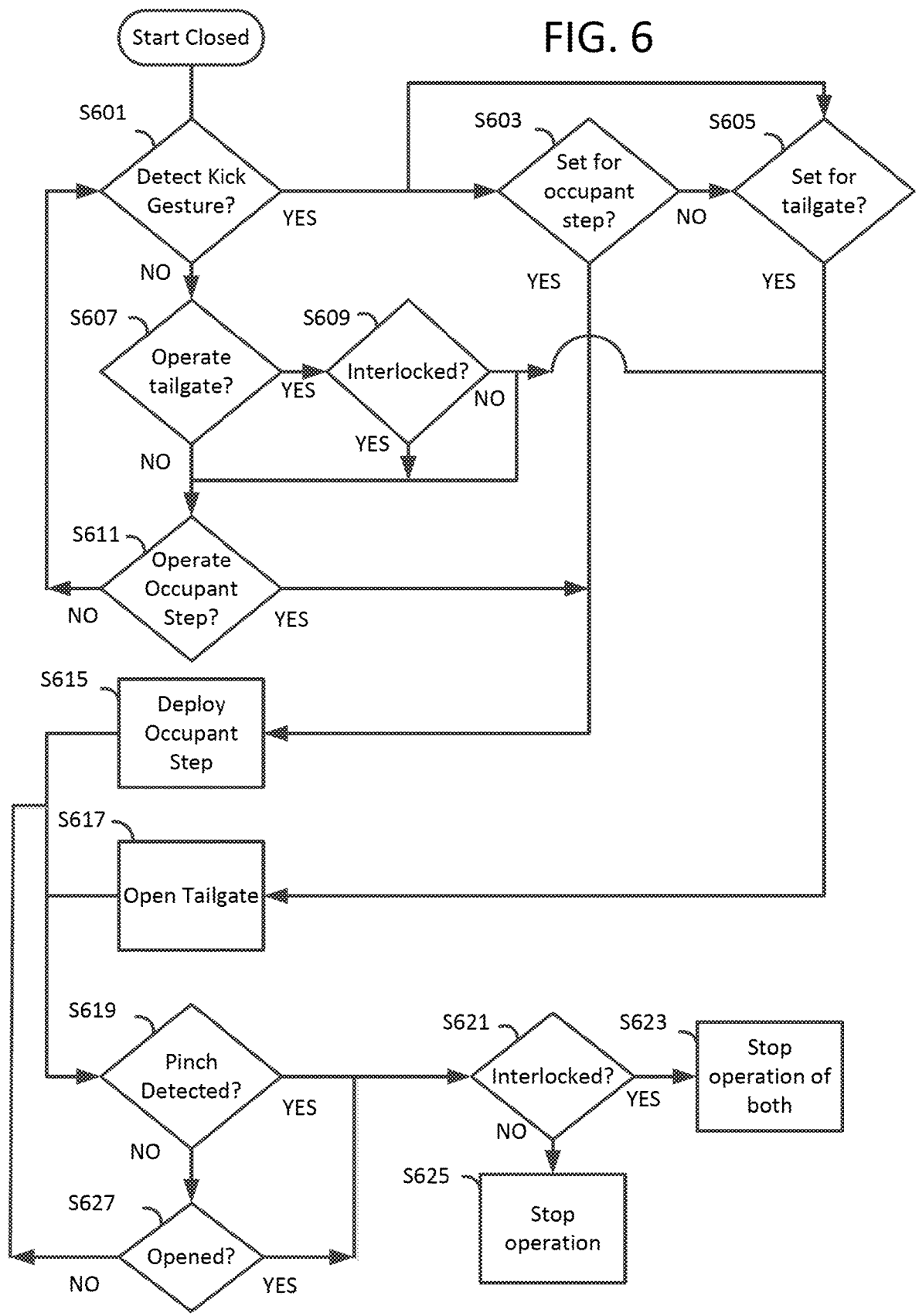
FIG. 6 is a flowchart for operation of the control system of FIG. 2 starting from closed position.

FIG. 6 is a flowchart for operation of the control system of FIG. 2 starting from closed position. In particular, the flowchart assumes a starting state in which the vehicle tailgate 103 is in a closed position and an occupant step 301 is in a retracted state. The flowchart also assumes that the kick sensor 307 is configured to detect a kick gesture performed by a person. In S601, upon detection of a kick gesture (YES in S601), the controller 201 checks settings for the occupant step 301 and tailgate 103. In some embodiments, the controller 201 may be set through a user interface, such as a touchscreen, to operate one of the occupant step 301 and the tailgate 103, or both, when a kick gesture is detected by the kick sensor 305. In S603, the controller 201 checks whether the occupant step 301 is set. Even if the occupant step is not set (NO in S603), in S605, the controller 201 will also check whether the tailgate 103 is set. In S617, the tailgate may be operated based on the detection of the kick gesture. Otherwise, both the occupant step and the tailgate may be set to operate in an interlocked manner, in which case in S615 the controller 201 sends a signal to an actuator 239 to deploy the occupant step 301. Also, in S617, the controller 201 sends a signal to an actuator 231 to open the tailgate 103. When both the occupant step 301 and the tailgate 103 are set to operate in an interlocked manner, the controller 201 may instruct operation of both the occupant step 301 and the tailgate 103 substantially simultaneously. In some embodiments, the controller 201 may be configured to set a setting that prevents either the occupant step motor or the tailgate motor from being operated, or that prevents both the occupant step motor and the tailgate motor from operating.

In some embodiments, the tailgate 103 and the occupant step 301 may be operated using alternative forms of interaction. For example the vehicle may be equipped with a button, switch, or touchscreen interface 225, 227 that may be used to engage operation of the tailgate 103, occupant step 301 or both. Also, the tailgate may be operated by lifting a handle 107 that activates a handle switch 221 and a latch 105. There may be situations where the person intends to open the tailgate 103 without also extending the occupant step 301. As such, when the controller 201 does not detect a kick gesture (NO in S601), the controller 201 may still receive a signal, via handle switch 221, indicating that the handle 107 has been manipulated to cause the tailgate latch 105 to disengage the tailgate. In S607, upon receiving a signal from the handle switch 221 (YES in S607), the controller 201, in S609 may check if the occupant step 301 and the tailgate 103 are set to an interlocked state. If the tailgate 103 is not set to be liked (NO in S609), the receiving of the signal from the handle switch 221 will trigger the controller 201 to, in S617, control an actuator 231 to lower the tailgate. When the tailgate 103 and the occupant link 301 are set to be interlocked (YES in S609), in S611, the controller 201 will check that the occupant step is set to be operated. When the occupant step 301 is set to be operated (YES in S611), in S615 the occupant step 301 will be operated in interlocked fashion with the lowering of the tailgate.

A vehicle may be equipped with t power back door (PBD) or a power side door (PSD). In some embodiments, instead of interlocking the occupant step 301 with a tailgate 103, the occupant step 301 may be interlocked with a power back door. In some embodiments, the occupant step 301 may be interlocked with a power side door. In this embodiment, the kick sensor may be incorporated into the occupant step and used to operate the occupant step and power back door in an interlocking or non-interlocking fashion. In some embodiments, the occupant step may be a side rail that extends out interlocked with opening of a power side door. In this embodiment, the kick sensor may be incorporated on the side rail and used to operate the side rail and the power side door in interlocking or non-interlocking fashion.

In some embodiments, the controller 201 may detect a pinch in either the occupant step 301 or the tailgate 103, or both, while the occupant step 301 is being deployed or while the tailgate 103 is opening. As mentioned above, a pinch may be detected when the spindle for the occupant step receives a force in the opposite direction of operation movement that is greater than a predetermined force threshold. In S619, when a pinch is detected (YES in S619), the controller 201 determines whether the occupant step 301 and tailgate 103 are interlocked. In some embodiments, when the controller 201 detects a pinch in either the occupant step 301 or the tailgate 103, the controller 201 may activate a warning buzzer. The warning buzzer may be one or more indicator lights, for example a blinking LED light, or may be a sound, such as a beeping sound, or may be both indicator lights and sound. The warning buzzer may inform an occupant that is being pinched that the occupant step 301 or tailgate 103, or both, is being stopped due to pinching that exceeds a predetermined force. In some embodiments, the action of stopping an operation may allow for resuming operation if the pinching force is discontinued within a predetermined period of time. For example, if upon activating a warning buzzer, an occupant moves clear of the occupant step 301 and/or tailgate 103 that is undergoing a pinch force within a few seconds, the operation may be resumed as though no pinch had been detected.

In some embodiments, when the controller 201 detects a pinch in either the occupant step 301 or the tailgate 103, the controller 201 may activate a hazard lamp. The hazard lamp may be an existing hazard lamp on the exterior of a vehicle. For example, a hazard lamp may be the same hazard lamp that is activated by pressing a hazard button on the dash of a vehicle. In a similar fashion, the hazard lamp may be accomplished by a controlling a flashing pattern on all turning lights. The hazard lamp may be used to inform an occupant that is being pinched that the occupant step 301 or tailgate 103, or both is being stopped due to pinching that exceeds a predetermined force.

In S623, when the controller 201 determines that the occupant step 301 and tailgate 103 are interlocked (YES in S621), the controller 201 will stop operation of both the occupant step 301 and the tailgate 103 substantially simultaneously. In some embodiments, the controller 201 may then operate both the occupant step 301 and the tailgate 103 to move in a reverse direction, in which case the occupant step 301 is moved to a retracted position and the tailgate 103 is moved to a closed position. Also, in some embodiments, if a pinch is detected while the occupant step 301 is being moved to a retracted position or while the tailgate 103 is being moved to a closed position, operation of both the occupant step 301 and the tailgate 103 is stopped. When the controller 201 determines that the occupant step 301 and the tailgate 103 are not interlocked, operation of one of the occupant step 301 and the tailgate 103 is stopped depending on which one the pinch is detected. Also, operation of one of the occupant step 301 and the tailgate 103 may be reversed after being stopped.

In some embodiments, the controller 201 is configured to monitor the state of the occupant step 301 and tailgate 103 based on signals sent to received from a respective actuator 231, 233, 235, 237, and 239. In some embodiments, when the controller 201 detects one of the tailgate 103 and the occupant step 301 in the opened state, the state of both the tailgate and occupant step are set to the opened state.

Figure 7:
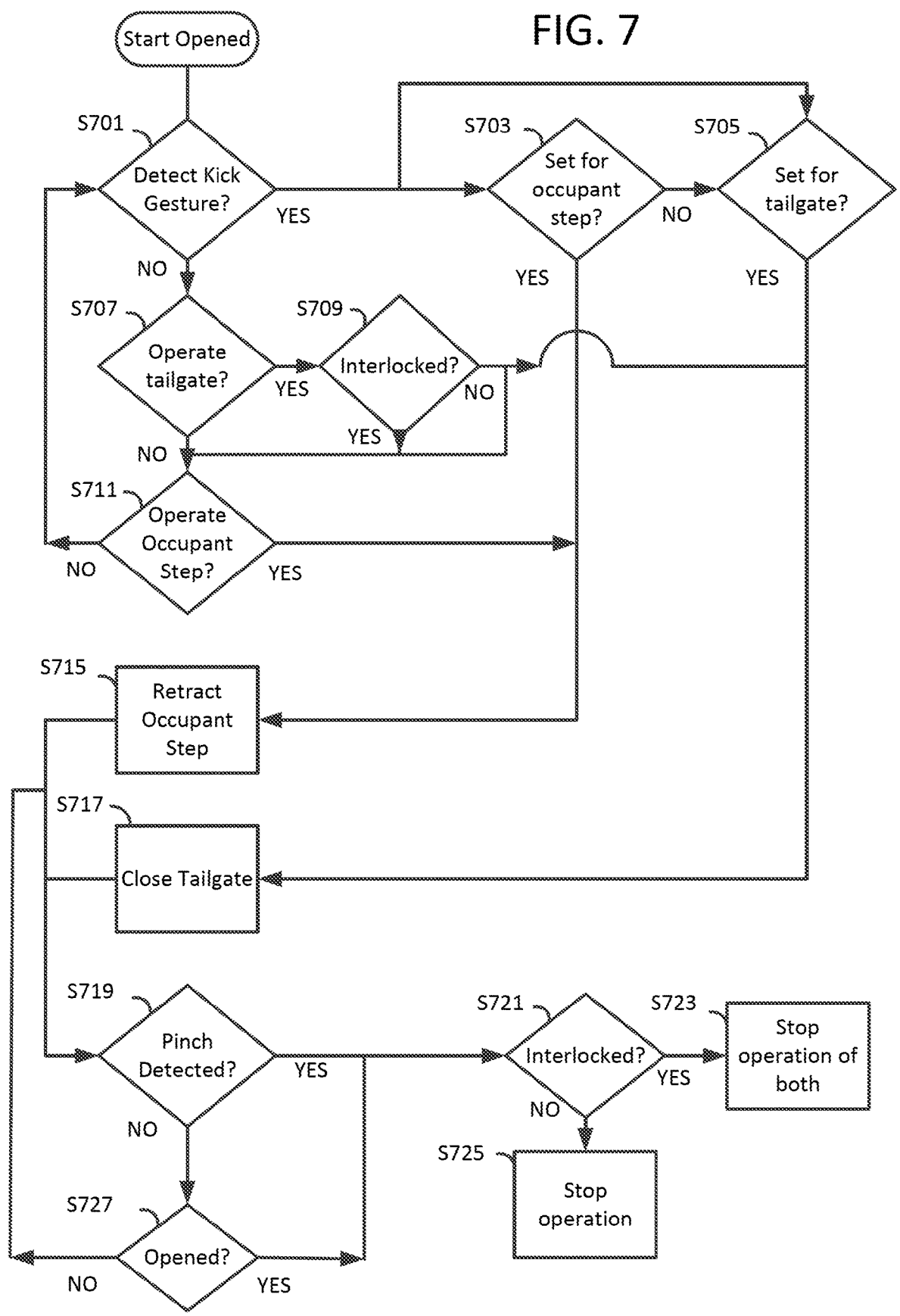
FIG. 7 is a flowchart for operation of the control system of FIG. 2 starting from opened position.

FIG. 7 is a flowchart for operation of the control system of FIG. 2 starting from closed position. In particular, the flowchart assumes a starting state in which the vehicle tailgate 103 is in o fully opened position and an occupant step 301 is in a fully extended state. The flowchart also assumes that the kick sensor 307 is configured to detect a kick gesture performed by a person. In S701, upon detection of a kick gesture (YES in S701), the controller 201 checks settings for the occupant step 301 and tailgate 103. In some embodiments, the controller 201 may be set through a user interface, such as a touchscreen, to operate one of the occupant step 301 and the tailgate 103, or both, when a kick gesture is detected by the kick sensor 305. In S703, the controller 201 checks whether the occupant step 301 is set. Even if the occupant step is not set (NO in S703), in S705, the controller 201 will also check whether the tailgate 103 is set. In S717, the tailgate may be operated based on the detection of the kick gesture. Otherwise, both the occupant step and the tailgate may be set to operate in an interlocked manner, in which case in S715 the controller 201 sends a signal to an actuator 239 to retract the occupant step 301. Also, in S717, the controller 201 sends a signal to an actuator 231 to close the tailgate 103. When both the occupant step 301 and the tailgate 103 are set to operate in an interlocked manner, the controller 201 may instruct operation of both the occupant step 301 and the tailgate 103 substantially simultaneously. In some embodiments, the controller 201 may be configured to set a setting that prevents either the occupant step motor or the tailgate motor from being operated, or that prevents both the occupant step motor and the tailgate motor from operating.

In some embodiments, the tailgate 103 and the occupant step 301 may be operated using alternative forms of interaction. For example, the vehicle may be equipped with a button, switch, or touchscreen interface 225, 227 that may be used to engage operation of the tailgate 103, occupant step 301 or both. Also, the tailgate may be operated by lifting a handle 107 that activates a handle switch 221. There may be situations where the person intends to close the tailgate 103 without also retracting the occupant step 301. As such, when the controller 201 does not detect a kick gesture (NO in S701), the controller 201 may still receive a signal, via handle switch 221, indicating that the handle 107 has been manipulated. In S707, upon receiving a signal from the handle switch 221 (YES in S707), the controller 201, in S709 may check if the occupant step 301 and the tailgate 103 are set to an interlocked state. If the tailgate 103 is not set to be liked (NO in S709), the receiving of the signal from the handle switch 221 will trigger the controller 201 to, in S717, control an actuator 231 to raise the tailgate. When the tailgate 103 and the occupant link 301 are set to be interlocked (YES in S709), in S711, the controller 201 will check that the occupant step is set to be operated. When the occupant step 301 is set to be operated (YES in S711), in S715 the occupant step 301 will be operated in interlocked fashion with the raising of the tailgate.

In some embodiments, the controller 201 may detect a pinch in either the occupant step 301 or the tailgate 103, or both, while the occupant step 301 is being retracted or while the tailgate 103 is closing. As mentioned above, a pinch may be detected when the motor for the occupant step receives a force in the opposite direction of operation movement that is greater than a predetermined force threshold. In S719, when a pinch is detected (YES in S719), the controller 201 determines whether the occupant step 301 and tailgate 103 are interlocked. In some embodiments, when the controller 201 detects a pinch in either the occupant step 301 or the tailgate 103, the controller 201 may activate a warning buzzer. The warning buzzer may be one or more indicator lights, for example a blinking LED light, or may be a sound, such as a beeping sound, or may be both indicator lights and sound. The warning buzzer may inform an occupant that is being pinched that the occupant step 301 or tailgate 103, or both, is being stopped due to pinching that exceeds a predetermined force. In some embodiments, the action of stopping an operation may allow for resuming, operation if the pinching force is discontinued within a predetermined period of time. For example, if upon activating a warning buzzer, an occupant moves clear of the occupant step 301 and/or tailgate 103 that is undergoing a pinch force within a few seconds, the operation may be resumed as though no pinch had been detected.

In S723, when the controller 201 determines that the occupant step 301 and tailgate 103 are interlocked (YES in S721), the controller 201 will stop operation of both the occupant step 301 and the tailgate 103 substantially simultaneously. In some embodiments, the controller 201 may then operate both the occupant step 301 and the tailgate 103 to move in a reverse direction. Also, in some embodiments, if a pinch is detected while the occupant step 301 is being moved to a retracted position or while the tailgate 103 is being moved to a closed position, operation of both the occupant step 301 and the tailgate 103 is stopped. When the controller 201 determines that the occupant step 301 and the tailgate 103 are not interlocked, operation of one of the occupant step 301 and the tailgate 103 is stopped depending on which one the pinch is detected. Also, operation of one of the occupant step 301 and the tailgate 103 may be reversed after being stopped.

Figure 8:
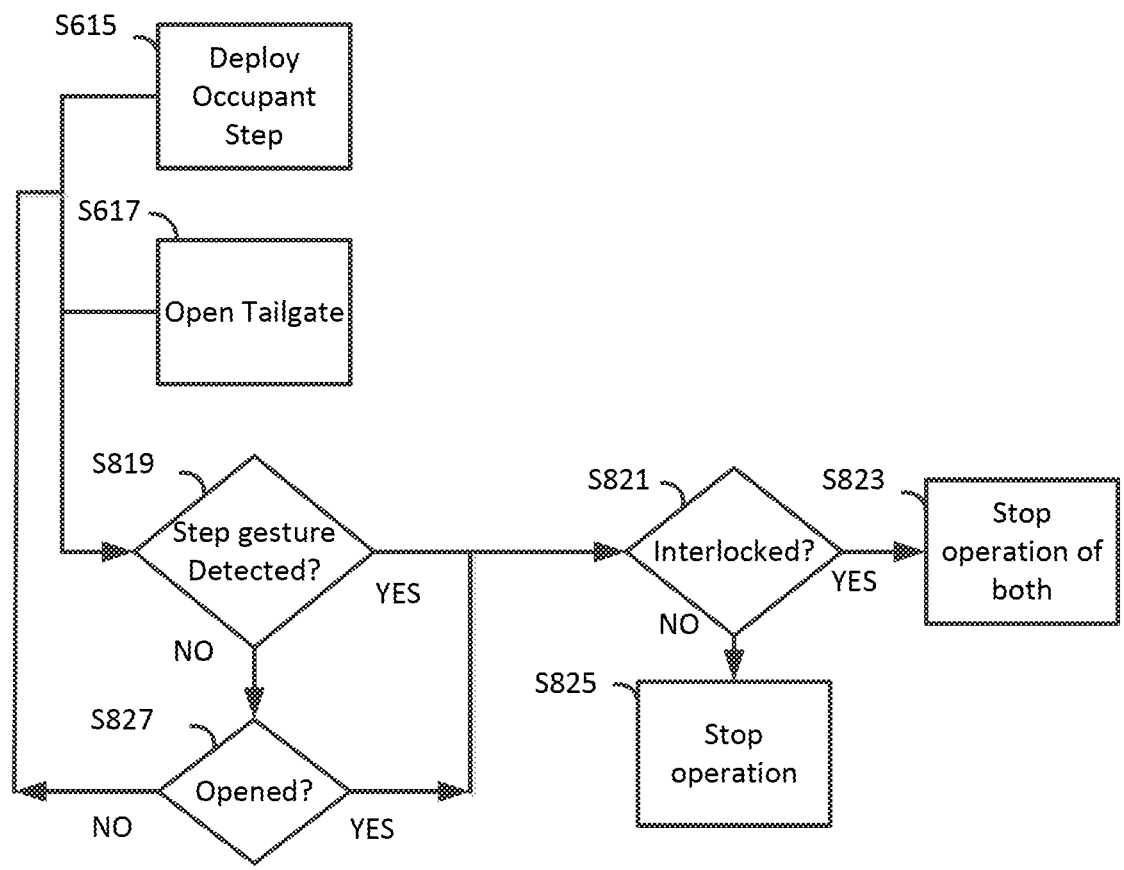
FIG. 8 is a flowchart for operation of the control system of FIG. 2 with a step gesture of FIG. 6.

FIG. 8 is a flowchart for operation of the control system of FIG. 2 with a step gesture of FIG. 6. As noted above, upon detection of a kick gesture the occupant step 301 is deployed (S615), the tailgate 103 is opened (S617), or both, may be operated simultaneously. In some embodiments, when the occupant step 301 is deploying and/or the tailgate 103 is opening and, in S819, a step on gesture and/or step off gesture is detected, there is a risk of getting caught. In S821, when the occupant step 301 and the tailgate 103 are interlocked (YES in S821), in S823, operation of both the occupant step 301 and the tailgate 103 is stopped. Otherwise, in S825, the controller 201 will stop operation of the occupant step 301. While a step gesture is not detected (NO in S827), the occupant step 301 and/or the tailgate 103 will continue to be operated. In some embodiments, upon detection of a step on or step off gesture (YES in S819), the controller 201 may control operation of the occupant step 301 and/or tailgate 103 to reverse operation.

Figure 9:
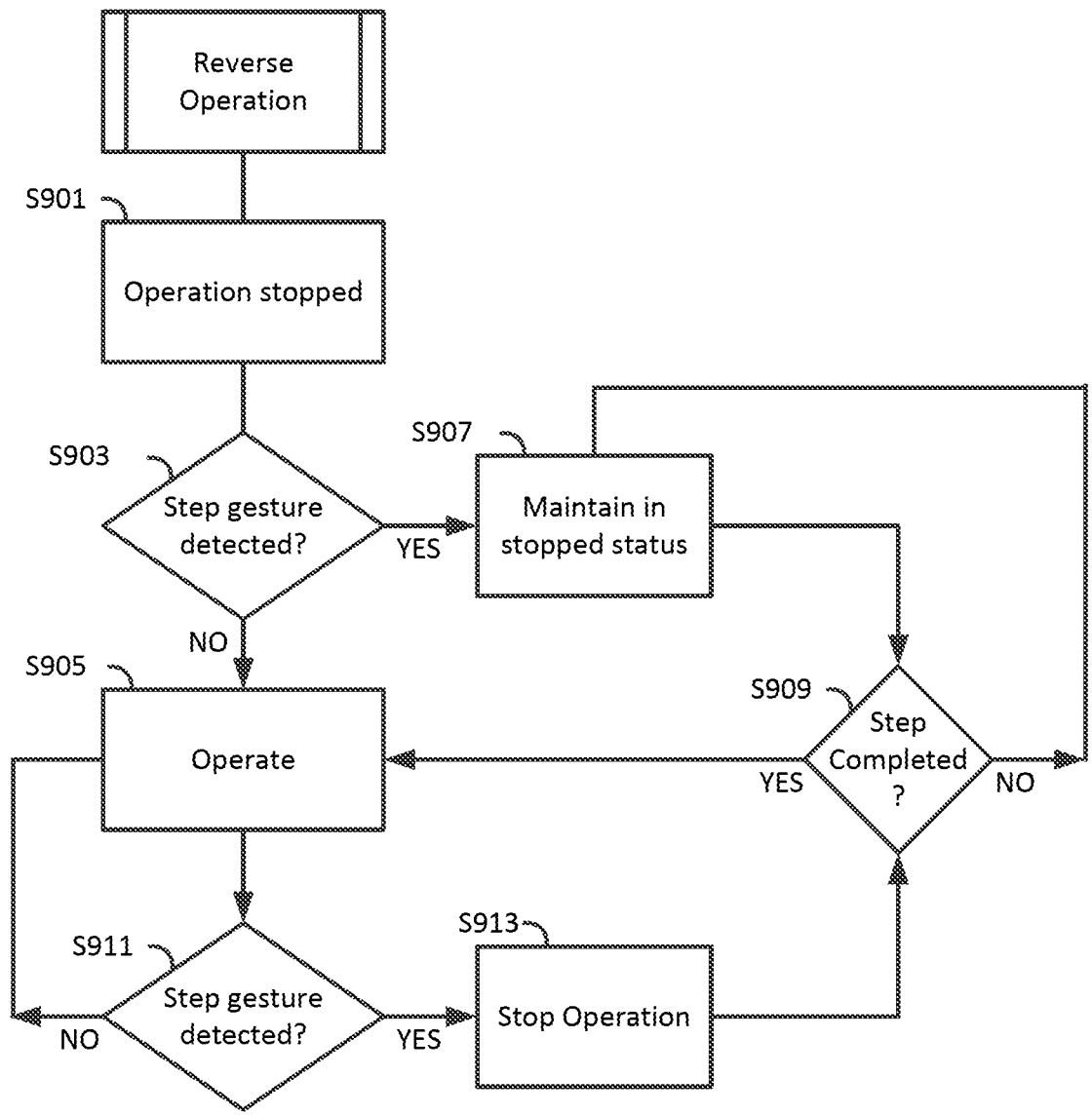
FIG. 9 is a flowchart for operation of the control system of FIG. 2 with a step gesture.

FIG. 9 is a flowchart for operation of the control system of FIG. 2 with a step gesture. As noted above, upon detection of a pinch while the occupant step 301 is deploying or while the tailgate 103 is opening (YES, in S619), the controller 201 will stop operation of the occupant step 301, the tailgate 103 (S625), or both (S623). In some embodiments the occupant step 301 may begin a reverse operation of moving back toward a retracted position.

In some embodiments, a step gesture may be detected while the occupant step 301 is being operated. The controller 201 may be configured to stop operation of the occupant step 301 when a step gesture is detected. In such case, the occupant step 301 is prevented from causing any pinching. There may also be cases where an occupant begins to step onto the occupant step 301 while it is beginning to move in a reverse direction. Similarly, there may also be cases where an occupant begins to step off of the occupant step 301 as the occupant step 301 begins to reverse operation. Regarding FIG. 9, in S901 the status of the occupant step 301 may be stopped, for example following a detection of a pinch (S619 or S719). To prevent harming the occupant, in S903, the controller 201 may detect a step gesture (YES in S803). When a step gesture is detected, in S907 the occupant step 301 may maintain a stopped status. The occupant step 301 may remain in the stopped status until a step off gesture is detected (YES in S909). Upon detection of a step off gesture, in S905 the occupant step 301 may resume reverse operation. Also, while no step gesture is detected (NO in S903), the occupant step 301 will continue with reverse operation, unless a step gesture is detected (YES in S911), in which case, in S913 the occupant step 301 will be controlled to stop operation.

Numerous modifications and variations are possible in light of the above teachings. It is therefore to be understood that within the scope of the appended claims, the invention may be practiced otherwise than as specifically described herein.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

What is claimed is:

1. An occupant step apparatus for a vehicle, comprising:
a powered occupant step;
a kick sensor mounted to the occupant step; and
a controller having processing circuitry configured to:
detect a kick gesture signal from the kick sensor,
control operation of the powered occupant step to move the occupant step, and
upon detection of a step gesture signal from the kick sensor, halt operation of the occupant step, the step gesture signal having a square pulse signal different from a peak pulse signal of the kick gesture signal.

2. The occupant step apparatus of claim 1, wherein the processing circuitry is further configured to:
upon detection of a step gesture signal from the kick sensor while the occupant step is being operated, stop the operation of the occupant step or send a signal to reverse operation of the occupant step.

3. The occupant step apparatus of claim 2, wherein after the step gesture signal is detected and the occupant step is in stopped status, the processing circuitry is further configured to control operation of the occupant step to move in reverse.

4. The occupant step apparatus of claim 1, wherein upon detection of a step off gesture signal from the kick sensor, the processing circuitry is configured to resume operation to move the occupant step.

5. The occupant step apparatus of claim 1, wherein the kick sensor is a capacitive sensor that detects an approaching object by a change in capacitance to a predetermined capacitance threshold.

6. The occupant step apparatus of claim 2, further comprising at least one of a warning buzzer and a hazard lamp,
wherein when a pinch is detected, the processing circuitry is configured to activate at least one of the warning buzzer and the hazard lamp.

7. The occupant step apparatus of claim 2, wherein when a pinch force is detected in the occupant step, the processing circuitry is configured to control operation to move the occupant step in reverse.

8. The occupant step apparatus of claim 2, wherein a pinch force is detected when a motor for the occupant step receives a force in the opposite direction of operation movement that causes a decrease in motor speed or an increase in load that is greater than a predetermined threshold.

9. The occupant step apparatus of claim 8, wherein the controller is configured to set a setting that prevents the motor from operating.

10. The occupant step apparatus of claim 1, wherein the powered occupant step is a powered running board provided on a lower side of the vehicle adjacent to one or more passenger doors.

11. The occupant step apparatus of claim 10, wherein the processing circuitry is configured to:
upon detection of a pinch force in the motor of the running board, stop the operation of the running board and send a signal to reverse operation of the running board, and
when a step gesture signal is detected while the signal to reverse operation is being sent, maintain the running board in a stopped status.

12. The occupant step apparatus of claim 11, wherein the processing circuitry is configured to:
after the step gesture signal is detected and the running board is in stopped status, operate the running board to move in reverse.

13. The occupant step apparatus of claim 11, wherein the processing circuitry is configured to:
upon detection of a step off gesture signal from the kick sensor, resume operation to move the occupant step.

14. A method for an occupant step of a vehicle including a powered occupant step, a kick sensor mounted to the occupant step, and a controller having processing circuitry, the method comprising:
detecting, by the processing circuitry, a kick gesture signal from the kick sensor,
operating, by the processing circuitry, the occupant step to move the occupant step,
upon detection of a step gesture signal from the kick sensor, halt operation of the occupant step or reverse operation of the occupant step, the step gesture signal having a square pulse signal different from a peak pulse signal of the kick gesture signal.

15. The method of claim 14, wherein upon detection of a step gesture signal from the kick sensor while the occupant step is being operated, stopping, by the processing circuitry, the operation of the occupant step or sending a signal to reverse operation of the occupant step.

16. The method of claim 15, wherein after the step gesture signal is detected and the occupant step is in stopped status, controlling, by the processing circuitry, operation of the occupant step to move in reverse.

17. The method of claim 14, wherein upon detection of a step off gesture signal from the kick sensor, resuming operation, by the processing circuitry, to move the occupant step.

18. The method of claim 15, wherein when a pinch force is detected in the occupant step, controlling operation, by the processing circuitry, to move the occupant step in reverse.

19. The occupant step apparatus of claim 1, wherein the step gesture signal has an upward square pulse signal.

20. The occupant step apparatus of claim 4, wherein the step gesture signal has an upward square pulse signal and the step off gesture signal has a downward square pulse signal.

* * * * *